United States Patent
Yamashita

[11] Patent Number: 5,875,100
[45] Date of Patent: Feb. 23, 1999

[54] HIGH-DENSITY MOUNTING METHOD AND STRUCTURE FOR ELECTRONIC CIRCUIT BOARD

[75] Inventor: Koji Yamashita, Tokyo, Japan

[73] Assignee: NEC Corporation, Tokyo, Japan

[21] Appl. No.: 865,809

[22] Filed: May 30, 1997

[30] Foreign Application Priority Data

May 31, 1996 [JP] Japan ................................. 8-139275

[51] Int. Cl.⁶ .............................. H05K 1/14; H05K 1/16
[52] U.S. Cl. ...................... 361/764; 257/723; 257/773; 361/761; 361/773; 361/792
[58] Field of Search ..................... 174/255, 256, 174/260, 261; 228/180.21, 180.22; 257/684, 690, 692, 700, 723, 737, 738, 773, 775, 778, 780; 361/761, 762, 764, 763, 772, 773, 774, 779, 783, 792–795; 438/108, 612, 613, 665, 666

[56] References Cited

U.S. PATENT DOCUMENTS

| | | |
|---|---|---|
| 4,544,989 | 10/1985 | Nakabu et al. . |
| 4,993,148 | 2/1991 | Adachi et al. . |
| 5,014,111 | 5/1991 | Tsuda et al. .............................. 437/183 |
| 5,206,712 | 4/1993 | Kornrumpf et al. .................... 361/764 |
| 5,262,351 | 11/1993 | Bureau et al. ........................... 437/183 |
| 5,300,812 | 4/1994 | Lapinski et al. ........................ 257/723 |
| 5,315,486 | 5/1994 | Fillion et al. ............................ 361/795 |
| 5,508,561 | 4/1996 | Tago et al. ............................... 257/778 |
| 5,545,589 | 8/1996 | Tomura et al. .......................... 437/183 |
| 5,565,706 | 10/1996 | Miura et al. ............................. 257/723 |
| 5,757,072 | 5/1998 | Gorowitz et al. ....................... 257/700 |
| 5,786,628 | 7/1998 | Beilstein, Jr. et al. .................. 257/684 |

FOREIGN PATENT DOCUMENTS

| | | |
|---|---|---|
| 57-007147 | 1/1982 | Japan . |
| 60-209888 | 10/1985 | Japan . |
| 01175296 | 7/1989 | Japan . |
| 01175297 | 7/1989 | Japan . |
| 02301183 | 12/1990 | Japan . |
| 03008366 | 1/1991 | Japan . |
| 03262302 | 11/1991 | Japan . |
| 04018787 | 1/1992 | Japan . |
| 04073992 | 3/1992 | Japan . |
| 05114776 | 5/1993 | Japan . |
| 2 153 144 | 8/1985 | United Kingdom . |

Primary Examiner—Donald Sparks
Attorney, Agent, or Firm—Young & Thompson

[57] ABSTRACT

In a high-density mounting method for an electronic circuit board, a stud bump is formed on a connection terminal of a semiconductor chip. The semiconductor chip is buried in a printed circuit board such that the stud bump has a height almost equal to that of a surface of the printed circuit board. At least a surface of the printed circuit board where the semiconductor chip is buried is covered with a first insulating layer. A hole is formed in the first insulating layer by using a laser to expose the stud bump. A first wiring pattern is selectively formed on the first insulating layer, thereby connecting the first wiring pattern and the exposed stud bump to each other. A high-density mounting structure for an electronic circuit board is also disclosed.

6 Claims, 3 Drawing Sheets

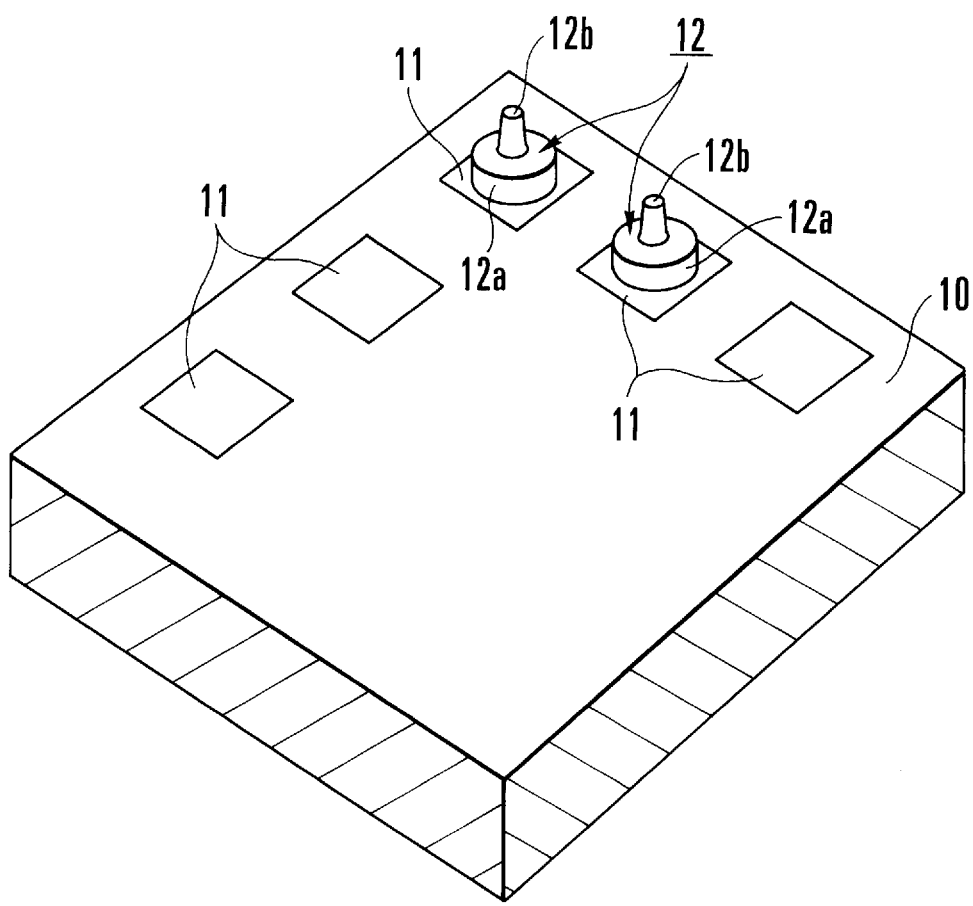
F I G. 2

HIGH-DENSITY MOUNTING METHOD AND STRUCTURE FOR ELECTRONIC CIRCUIT BOARD

BACKGROUND OF THE INVENTION

The present invention relates to a high-density mounting method and structure for an electronic circuit board and, more particularly, to a high-density mounting method and structure for an electronic circuit board suitably used in mounting a semiconductor chip, a surface mounted device (SMD), a multichip module (MCM), and the like on a printed circuit board with a high density.

Conventionally, as a high-density mounting method and structure for an electronic circuit board of this type, the following ones are known. Japanese Patent Laid-Open No. 1-175297 discloses a multilayer printed circuit board device in which semiconductor chips are buried in a board in order to perform high-density mounting. More specifically, in order to solve the problems posed by dipping the printed circuit board in a developing solution that adversely affects the semiconductor chips and the warp caused by mounting, two boards in which through holes having the sizes of the semiconductor chips are formed at the same positions are stuck on the two surfaces of one base board, thereby constituting a wiring board.

Japanese Patent Laid-Open No. 57-7147 discloses the mounting construction of a semiconductor device in which LSI chips are buried in a substrate to achieve high-density mounting. More specifically, a ball bump is formed on each LSI chip by bonding, and the LSI is buried in a recessed portion formed in an insulating substrate and is sealed. Subsequently, the sealed surface is flatly ground to expose the ball bump portion, and is metallized. Since the ball bump can be conducted and connected to a circuit by metallization, if the metal portion is removed to leave a necessary portion, a wiring pattern is formed.

The conventional high-density mounting method and structure for the electronic circuit board described above have the following problems. In the former case, semiconductor chips are buried in the upper and lower surfaces of the board to eliminate the warp. In practice, however, it is considerably difficult to arrange the semiconductor chips on the upper and lower surfaces of the board in terms of mounting the chips on the board and formation of a circuit, and the mounting operation is largely limited. Therefore, this device can be used in limited applications.

Boards in which holes are formed are stacked on the upper and lower surfaces of the base board for the purpose of formation of recessed portions, thereby realizing a multilayer structure. If the boards are pressed through a prepreg so that they are adhered to each other, the prepreg is squeezed to the peripheries of the boards and flows into the recessed portions as well. In other words, it is difficult to form precise recessed portions in the board. In order to bury the semiconductor chips, the squeezed prepreg must be removed afterwards.

In order to perform circuit formation without dipping the semiconductor chips in the developing solution, a wiring pattern is formed by printing a conductive paste. When recessed portions are formed in the board and the semiconductor chips are fitted in the recessed portions, gaps are formed inevitably. Accordingly, if a circuit is formed by printing on the board in which the semiconductor chips are fitted, the circuit forms a bridge even partially and tends to cause disconnection. In order to avoid this, if the circuit is formed by plating, this is against the original purpose of not dipping the printed circuit board in the plating solution. Even if the circuit is formed by plating, masking must be performed after plating, making the manufacturing method complicated.

In the latter case, when forming a wiring pattern to be connected to an LSI chip, a circuit is formed by etching after metallization. Etching generally employed in a printed circuit board is performed in the following manner. A photosensitive dry film is brought into tight contact with the printed circuit board. Only a necessary portion of the photosensitive dry film is photosensitized, and a portion of the photosensitive dry film other than the circuit portion is removed by etching. With this method, however, a flat place where the dry film can be adhered is required, and the step of flatly grinding the dry film until the bump of the LSI chip is exposed is required.

When connecting the bump and the circuit by metallizing the exposed bump, since the thermal expansion coefficient of the sealing member and that of the bump differ, if the size of the bump decreases, the connection reliability suffers when influenced by the thermal stress. In particular, the recent IC pad pitch is 100 $\mu$m or less. If the IC pad pitch becomes small in this manner, the connection area becomes very small, posing a significant problem in reliability.

Basically, since the board is not a multilayer board but a double-sided board, connection of a complicated circuit is limited. When a large number of recessed portions are formed, a warp is caused in the entire board due to the shrinkage of the sealing resin.

SUMMARY OF THE INVENTION

It is an object of the present invention to provide a high-density mounting method and structure for an electronic circuit board in which high-density mounting is performed more simply and reliably.

In order to achieve the above object, according to an aspect of the present invention, there is provided a high-density mounting method for an electronic circuit board, comprising the steps of forming a stud bump on a connection terminal of an electronic component, and burying the electronic component in a board such that the stud bump has a height almost equal to that of a surface of the board, covering with a first insulating layer at least a surface of the board where the electronic component is buried, forming a hole in the first insulating layer by using a laser to expose the stud bump, and selectively forming a first wiring pattern on the first insulating layer, thereby connecting the first wiring pattern and the exposed stud bump to each other.

BRIEF DESCRIPTION OF THE DRAWINGS

FIG. 2 is an enlarged perspective view of the main part of a semiconductor chip showing the stud bump portions used in the high-density mounting structure for an the electronic circuit board.

DESCRIPTION OF THE PREFERRED EMBODIMENT

Figure 1A:
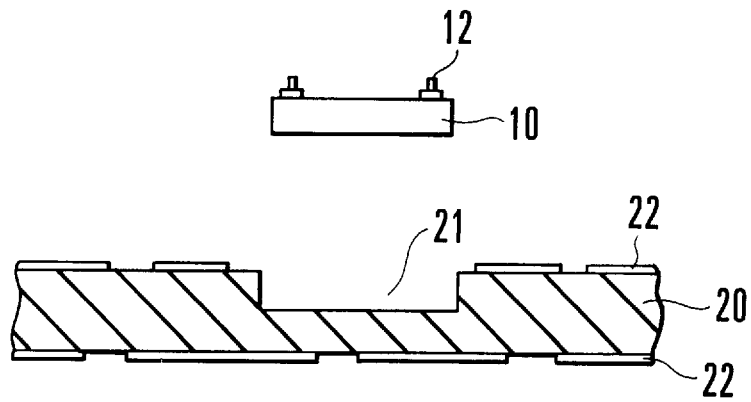
FIGS. 1A to 1G are views showing the manufacturing steps of a high-density mounting structure for an electronic circuit board according to an embodiment of the present invention.

The present invention will be described in detail with reference to the accompanying drawings.

FIG. 2 shows the main part of a semiconductor chip. A semiconductor chip 10 as an electronic component is constituted by a rectangular module incorporating a semiconductor. Connection terminals 11 serving as bonding pads are formed on the lower surface of the semiconductor chip 10, and metal stud bumps 12 are formed on the connection terminals 11 by bonding.

Each stud bump 12 has a thick disk portion 12a and a pin portion 12b projecting upward from the center of the disk portion 12a. The disk portion 12a has a diameter of about 80 $\mu$m and a thickness of about 25 $\mu$m. The wire of the pin portion 12b has a thickness of 25 $\mu$m and a length of about 30 $\mu$m. The stud bumps 12 are formed with a machine that performs wire bonding by changing the motion of a capillary in a software manner.

FIGS. 1A to 1G show the manufacturing steps of a high-density mounting structure for an electronic circuit board according to an embodiment of the present invention. A recessed portion 21 in which the semiconductor chip 10 can be buried is formed in a printed circuit board 20 (FIG. 1A). The recessed portion 21 is formed by skiving to a depth as the sum of the thickness of the semiconductor chip 10 and the thickness of the disk portion 12a of the stud bump 12, e.g., to a depth of 400 $\mu$m+25 $\mu$m. Accordingly, the printed circuit board 20 requires a thickness equal to or larger than the sum of a thickness of (the thickness of the semiconductor chip 10)+(the thickness of the disk portion 12a of the stud bump 12). As the recessed portion 21, a hole portion may be formed by punching. Reference numerals 22 denote wiring patterns formed on the upper and lower surfaces of the printed circuit board 20.

Figure 1B:
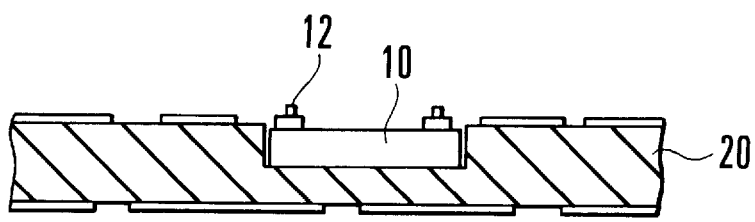
Figure 1C:
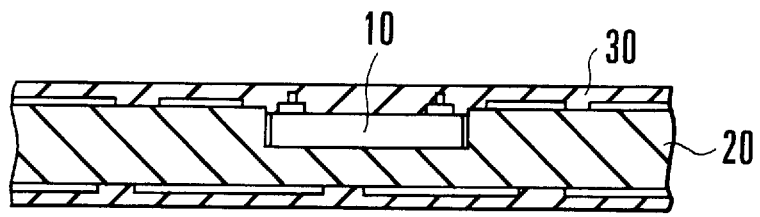

The bottom surfaces of the stud bumps 12 are bonded to the semiconductor chip 10, and thereafter the semiconductor chip 10 is mounted in the recessed portion 21 of the printed circuit board 20 as the pin portions 12b of the stud bumps 12 project from the recessed portion 21 (FIG. 1B). A resin for forming build-up layers is formed on the upper and lower surfaces of the printed circuit board 20 to a thickness of 50 $\mu$m by coating, thereby forming insulating layers 30 (FIG. 1C). Since the insulating layers 30 also serve as the sealing members for protecting the semiconductor chip 10, sealing is not performed by a separate step, but sealing of the semiconductor chip 10 and formation of the insulating layers 30 are performed simultaneously. As the material of the insulating layers 30, a material in which a hole can be formed by a laser, as will be described later, is selected.

Figure 1D:
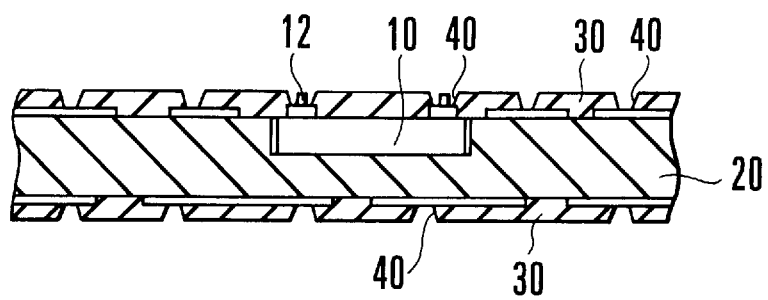

After the insulating layers 30 are formed, a $CO_2$ laser or an excimer laser is irradiated to form holes 40 in the insulating layers 30 at portions corresponding to the stud bumps 12 (FIG. 1D). The holes 40 are formed also in portions of the insulating layers 30 through which the wiring patterns 22 on the upper and lower surfaces of the printed circuit board 20 are connected to each other.

The positioning precision of the holes 40 with respect to the stud bumps 12 is determined by the positioning precision of the end face of the semiconductor chip 10 with respect to the wall surface of the recessed portion 21 of the printed circuit board 20. Therefore, depending on positioning of the semiconductor chip 10 with respect to the recessed portion 21, positioning errors may occur between the holes 40 and the wiring. If, however, each hole 40 is formed by the laser to have an open diameter of 100 $\mu$m, it has an inverted conical shape, and the hole 40 has a diameter of about 50 $\mu$m at a portion corresponding to the disk portion 12a of the stud bump 12. Since each stud bump 12 is disk-shaped and has the maximum diameter of about 80 $\mu$m, the holes 40 can sufficiently absorb the positioning errors described above. Regarding hole formation by using the laser, it can also be performed after the positions of the stud bumps 12 are recognized. In this case, fine connection becomes possible. If a dry film is used, position recognition of the stud bumps 12 cannot be performed, as a matter of course.

Since the holes 40 are formed by the laser in this manner, the semiconductor chip 10 need not be subjected to chemical treatment using, e.g., a developing solution. Since the laser is used, the build-up insulating layers 30 need not be photosensitive, unlike a dry film, and their material is not limited as far as it is an organic material. Also, as the material of the insulating layers 30, one having a low dielectric constant can be used. The material can be selected from a variety of choices.

Figure 1E:
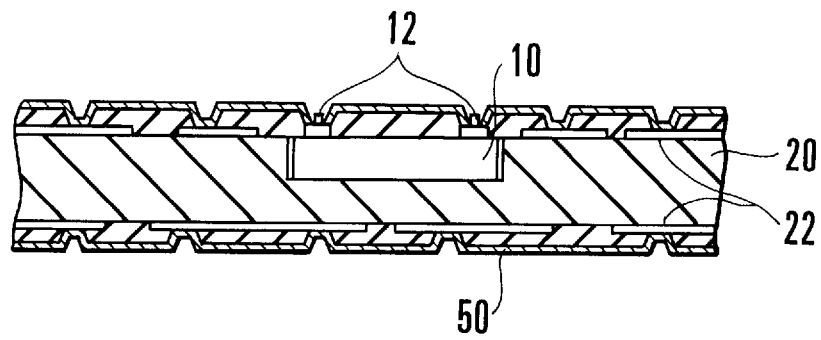

After the holes 40 are formed, metallized layers 50 are formed on the insulating layers 30 on the upper and lower surfaces of the printed circuit board 20 (FIG. 1E). Formation of the metallized layers 50 is performed by covering the entire surfaces of the insulating layers 30 with copper to a thickness of about 18 $\mu$m by sputtering or the like.

Figure 1F:
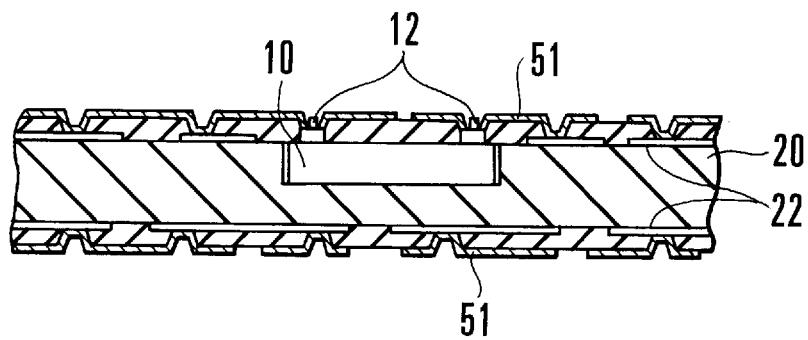

By using dry films, the metallized layers 50 are photosensitized to form wiring patterns 51, and the unnecessary portions of the metallized layers 50 are removed by etching, thereby selectively forming wirings (FIG. 1F). The wiring patterns 51, the wiring patterns 22 of the printed circuit board 20, and the stud bumps 12 are connected in formation of the wiring patterns 51.

In this case, depending on the degree of connection density, the wiring patterns 51 may be formed by electroplating or dry plating, i.e., sputtering. When sputtering is employed, the thicknesses of the wiring patterns 51 can be decreased, so that micropatterning can be performed accordingly.

The wiring patterns 51 formed on the build-up layers 30 by metallization can have a higher density than that formed with the conventional subtractive process. Generally, with the wiring patterns 51 having a thickness of 18 $\mu$m, fine patterning with a line to space ratio of 100/100 $\mu$m is said to be possible, although it differs depending on the thickness. When the wiring patterns 51 have a thickness of 10 $\mu$m, fine patterning with a line to space ratio of 50/50 $\mu$m is said to be possible. With the subtractive process, fine patterning with a line to space ratio of 150/150 $\mu$m is the limit. Therefore, with the method of the present invention, a higher-density mounting structure can be formed.

In order to add the build-up layers 30 and the wiring patterns 51 on the outer layers, it suffices to repeat the steps shown in FIGS. 1C to 1F, enabling formation of a multilayer structure easily. When a multilayer structure is to be formed, the layers may be formed while changing the materials. This is because hole formation is performed with a laser, enabling wide-range material selection.

When the build-up layers 30 are formed on the two surfaces of the printed circuit board 20, the degree of shrinkage becomes equal on the two surfaces. Then, the warp of the printed circuit board 20 can be eliminated.

Figure 1G:
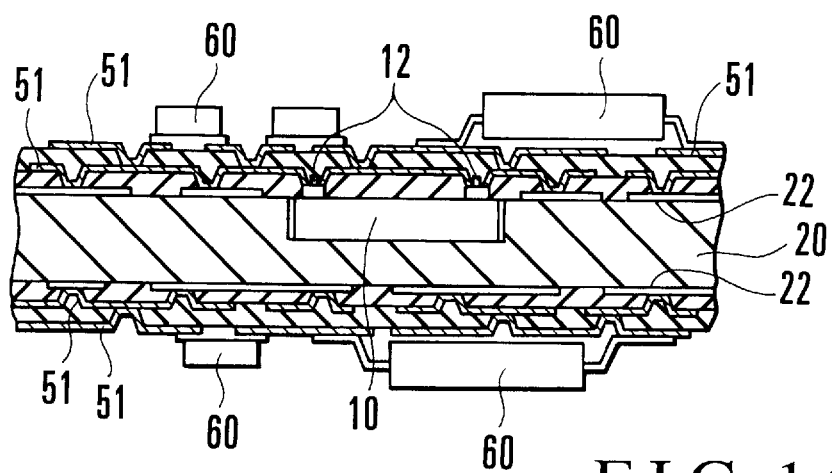

In this manner, the printed circuit board 20 incorporating the semiconductor chip 10 is manufactured, and surface mounted devices (SMD) 60 are mounted on the two surfaces of the printed circuit board 20 by utilizing the conventional Surface Mounted Technique (SMT) (FIG. 1G).

The present invention is not limited to the embodiment described above, but can be changed and modified as required without departing from the spirit and scope of the invention. For example, as the electronic component, any one to which a stud bump 12 can be bonded and which can be buried can be used. In place of the semiconductor chip 10, a rectangular module obtained by sealing a resistor and a capacitor in a ceramic member, or a multi-chip module (MCM) which is combined with a bare chip can be used. The stud bumps 12 are not limited to disk-shaped but can be, e.g., ball-shaped.

As an application of the present invention, a stud bump may be formed on a rectangular metal member and the resultant metal member may be buried, so that it can be utilized as a ground terminal and that the heat dissipation properties of the device surface-mounted on this ground terminal can be improved.

In a multilayer structure formed with build-up layers, even if through holes are not formed, the printed circuit board and the build-up layers can be connected to each other, thereby increasing the wiring density. With hole formation using the laser, various materials can be selected to be built up, thereby widening the range of choices in selecting the materials that can satisfy the required characteristics.

According to the above embodiment, there is provided a high-density mounting structure for an electronic circuit board, in which the semiconductor chip 10 serving as the electronic component is buried in the printed circuit board 20 and which is connected to the connection terminals 11 of the semiconductor chip 10 through the wiring patterns 51 formed on the surfaces of the board. After the stud bumps 12 are formed on the connection terminals 11 of the semiconductor chip 10, the semiconductor chip 10 is buried in the printed circuit board 20. After the upper and lower surfaces of the printed circuit board 20 are covered with the insulating layers 30, the holes 40 are formed in the layers 30 by the laser to expose the stud bumps 12. The wiring patterns 51 are formed on the exposed stud bumps 12, thereby connecting the stud bumps 12 to the circuit through the wiring patterns 51.

As has been described above, according to the present invention, after the stud-bonded electronic component is buried in the board, the board is coated with the insulating members, holes are formed with the laser, and the wiring patterns are formed. Therefore, the connecting portions of the electronic component which are connected to the wiring patterns becomes thick. As a result, a high-density mounting structure for an electronic circuit board that can simplify the manufacturing process while improving the reliability can be provided.

An adverse influence which is caused when dipping an electronic component, e.g., a semiconductor chip, in a developing solution or the like can be eliminated. More specifically, in metallization, the insulating layers are built up and coated, so that the semiconductor chip is sealed completely. Accordingly, even if the printed circuit board is dipped in the developing solution, no inconvenience occurs at all. Since the wiring patterns are formed by metallization, fine patterns can be formed. If metallization is performed not by electroplating but by dry plating, i.e., sputtering, the metallizing step can be performed without dipping the printed circuit board in a chemical solution. In addition, the wiring pattern can also be formed on the upper surface where the semiconductor chip is buried.

Even if the board is thin, warp does not occur. More specifically, since the insulating layers are formed on the upper and lower surfaces of the printed circuit board by coating with the build-up layers, the degrees of shrinkage become equal on the two surfaces, thereby eliminating the warp of the printed circuit board. Therefore, in mounting, similar recessed portions need not be formed in the upper and lower surfaces of the printed circuit board, thus eliminating mounting the limitation. It is a matter of course that the recessed portions may be present in both the upper and lower surfaces of the printed circuit board or only in one surface.

Since a prepreg that interferes with positioning of a semiconductor chip when burying the semiconductor chip is not formed, the step of removing the prepreg by grinding or the like becomes unnecessary.

A multilayer structure can be formed very efficiently. More specifically, after the semiconductor chip is mounted on the printed circuit board, the insulating layers are directly formed by coating with the build-up layers, so that sealing of the semiconductor chip and formation of the insulating layers can be performed simultaneously, avoiding the sealing process. Formation of the through holes for achieving connection in the multilayers and exposure of the bumps can be performed simultaneously with the laser, and the surfaces of the printed circuit board need not be planarized to expose the bumps of the semiconductor chip. With this process, formation of a multilayer structure can be performed easily, and connection can be made even with boards having a large number of components. Furthermore, since hole formation by means of the laser is not influenced by the material, the insulating members need not be photosensitive, and can be selected from a wide range. Accordingly, combinations of layers made of different materials become possible.

Since stud bumps are employed to connect the circuit pattern and the bumps of the semiconductor chips, fine connection can be performed.

The connection reliability can be improved. More specifically, in the connecting portion where the bumps of the semiconductor chip and the wiring patterns are connected, they are connected not only on the upper surfaces of the bumps, but rather the entire projecting portions of the stud bumps are connected to the wiring patterns. With this structure, fine connection can be coped with, and the area of the connecting portion is increased, thus improving the reliability.

What is claimed is:

1. A high-density mounting structure for an electronic circuit board, comprising:

an electronic component having a connection terminal to which a stud bump is bonded;

a board in which said electronic component is to be buried, said stud bump being substantially flush with a surface of said board;

a first insulating layer for covering at least a surface of said board in which said electronic component is buried;

a hole formed in said first insulating layer to expose said stud bump; and a first wiring pattern selectively formed on said first insulating layer, said first wiring pattern being connected to said stud bump which is exposed.

2. A structure according to claim 1, wherein said board has a recessed portion for mounting said electronic component therein, and said first insulating layer covers said electronic component mounted in said recessed portion and said first insulating layer.

3. A structure according to claim 1, wherein said first insulating layer is formed on each of two surfaces of said board with an insulating material by coating.

4. A structure according to claim 1, wherein said first wiring pattern is formed by selectively removing a metallized layer formed on said insulating layer.

5. A structure according to claim 1, further comprising:
   a second insulating layer formed on said first insulating layer on which said first wiring pattern is formed;
   a hole formed in said second insulating layer to expose said first wiring pattern; and
   a second wiring pattern selectively formed on said second insulating layer to be connected to said first wiring pattern which is exposed.

6. A structure according to claim 1, further comprising a third wiring pattern formed on said board, and
   wherein said hole is formed in said first insulating layer to correspond to said third wiring pattern, thereby exposing said third wiring pattern, and
   said first wiring pattern is connected to said third wiring pattern which is exposed.

* * * * *